US005331285A

United States Patent [19]

Marshall et al.

[11] Patent Number: 5,331,285

[45] Date of Patent: Jul. 19, 1994

[54] RESISTIVELY PROGRAMMABLE INTERFACE FOR AN ANALOG DEVICE

[75] Inventors: Andrew Marshall, Dallas; Frank L. Thiel, Sachse, both of Tex.

[73] Assignee: Texas Instruments Incorporated, Dallas, Tex.

[21] Appl. No.: 720,354

[22] Filed: Jun. 25, 1991

[51] Int. Cl.[5] ........................ G01R 27/08; G05B 23/02

[52] U.S. Cl. .................................... 324/713; 364/130; 364/146; 364/807

[58] Field of Search ............... 324/713, 602, 603, 609; 364/146, 492, 130, 800, 807

[56] References Cited

U.S. PATENT DOCUMENTS

| | | | |
|---|---|---|---|
| 3,821,624 | 6/1974 | Iadipaolo et al. | 364/130 X |
| 3,838,258 | 9/1974 | Logan | 364/130 X |
| 4,387,421 | 6/1983 | Zach et al. | 364/148 |
| 4,801,854 | 1/1989 | Conrath | 364/146 X |
| 5,272,445 | 12/1993 | Lloyd et al. | 324/713 X |
| 5,276,767 | 1/1994 | Nakamura | 364/807 X |

*Primary Examiner*—Kenneth A. Wieder
*Assistant Examiner*—Glenn W. Brown
*Attorney, Agent, or Firm*—Wade James Brady; Richard L. Donaldson

[57] ABSTRACT

A resistively programmable interface for controlling an analog device such as a solenoid or lamp comprises input circuitry having a plurality of nodes, measuring circuitry for determining voltages and currents at the nodes, and controlling circuitry for operating the device in accordance with the measured voltages and currents.

27 Claims, 2 Drawing Sheets

RESISTIVELY PROGRAMMABLE INTERFACE FOR AN ANALOG DEVICE

TECHNICAL FIELD OF THE INVENTION

This invention relates in general to the field of integrated electronic devices and more particularly, to an apparatus and method for resistively programming an interface for controlling an analog device.

BACKGROUND OF THE INVENTION

Certain integrated circuits (ICs) that are designed to handle large amounts of current are often limited to low pin-count packages. Typically, such devices have only 5, 7, or 9 leads along a single side of the IC. A heat sink typically occupies an entire face of the package and is often capable of being attached to a much larger system heat sink for cooling purposes. It is the size and mounting requirements of the heat sink that precludes an electronics designer from using all sides of the IC package for external signal routing.

The same power handling criteria require that at least some of the IC leads be larger than normal. The voltage supply, ground and output leads in particular must be oversize to avoid unnecessary voltage drops. The combined effect of the heat sink and the oversize leads severely limits the number of pins mountable on such an IC.

ICs that process microwave signals have problems with similar results. There, problems of lead inductance and capacitance mandate few pins.

The electronics market is driving, and will continue to drive, the complexity of high current ICs to greater and greater levels. The engineering problems described above, however, limit the number of pins and, hence, the potential complexity of the external interface of a high IC current. The result of this juxtaposition is that the IC design engineer must attempt to control a certain number of parameters through a small number of input pins. A high current 7-pin IC, for instance, only has two available pins once the input, output, power supply, ground, and fault signals are taken into account. These two pins and the input pin must control all of the operating parameters of an IC. The input pin customarily receives a logic on-off signal leaving the two remaining pins to handle all analog programming. The two pins, for instance, must control the pull-in current, pull-in time, and hold-in current when a 7-pin IC acts as a solenoid controller.

One solution would be to input control parameters into a system through two pins using a serial interface with digital encoding. Such a solution, however, would not be economically feasible in most instances.

Therefore, a need has arisen for an integrated circuit interface which is able to economically control a plurality of operating parameters with a limited number of package pins.

SUMMARY OF THE INVENTION

In accordance with the present invention, a resistively programmable interface is provided which substantially eliminates or reduces disadvantages and problems associated with prior interfaces. A resistively programmable interface for controlling an analog device comprises input circuitry having a plurality of input nodes, measuring circuitry for determining the voltage levels and currents at the nodes, and controlling circuitry for driving an analog device responsive to the measured voltages and currents.

The first technical advantage of the present invention is its ability to control three operating parameters with only two input pins.

The second technical advantage of the present invention is its adaptability. In particular, the device may be easily adapted to control a device with fewer than three operating parameters or in real time, by a single external time-dependent input.

A final technical advantage to the device of the present invention is its low cost. An analog device may be driven by a single IC with only three resistors. Expensive digital control equipment is therefore unnecessary.

BRIEF DESCRIPTION OF THE DRAWINGS

A more complete understanding of the present invention may be derived by referring to the detailed description and claims when considered in connection with the accompanying drawings, in which like reference numbers indicate like features through the drawings and wherein:

DETAILED DESCRIPTION OF THE INVENTION

Figure 1:
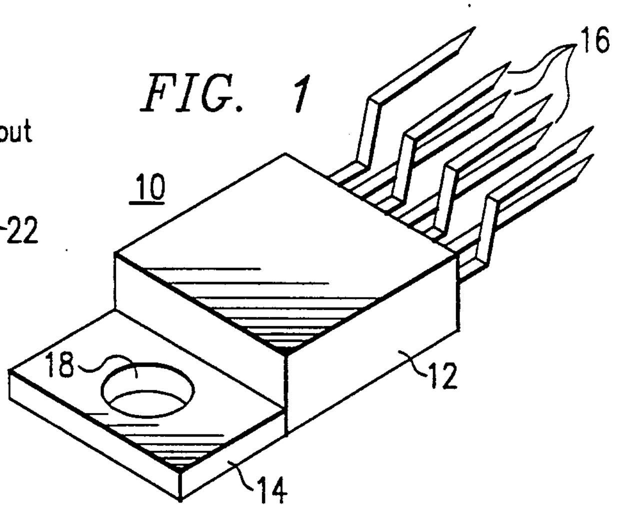
FIG. 1 is a perspective view of a 7-pin high current integrated circuit package.

FIG. 1 depicts a 7-pin high current integrated circuit package ("IC") 10. IC 10 has a body 12, a heat sink 14, and seven electrically conducting pins 16. Body 12 contains the internal electrical circuitry of IC 10 while pins 16 route all necessary electrical signals in and out of IC 10. Heat sink 14 dissipates the thermal energy created during the operation of IC 10. Heat sink 14 is designed with a hole 18 to facilitate integration into a system heat sink (not shown).

Figure 2A:
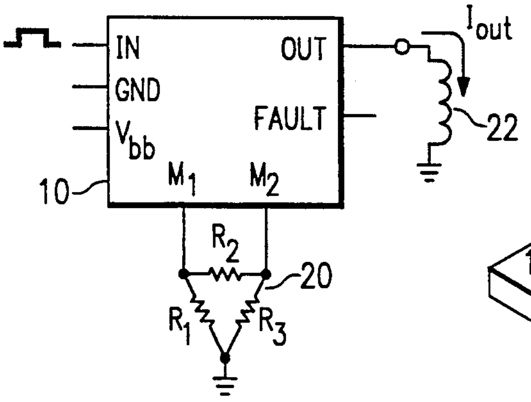
FIG. 2*a* is a diagram of a 7-pin integrated circuit containing the present invention in a first mode.

FIG. 2*a* depicts an IC 10 in schematic form coupled with resistive network 20. The function of IC 10 is to drive a solenoid 22 depicted as an inductor. Resistive network 20 comprises three resistive devices $R_1$, $R_2$, and $R_3$. Resistive devices $R_1$, $R_2$, and $R_3$ are coupled in a triangular configuration. Resistive network 20 connects to two of the seven pins of IC 10, labelled $M_1$ and $M_2$. $M_1$ is attached to ground through resistor $R_1$. Similarly, $M_2$ is connected to ground through resistor $R_3$. Pins $M_1$ and $M_2$ are connected to one another through resistor $R_2$. IC 10 has four other pins labelled IN, $V_{bb}$, OUT, and FAULT. Pin IN receives a voltage signal indication of whether the solenoid should be in a retracted or extended position. Pin $V_{bb}$ receives the voltage supply, pin OUT outputs signals to control the solenoid, and pin FAULT indicates an error condition.

Figure 2B:
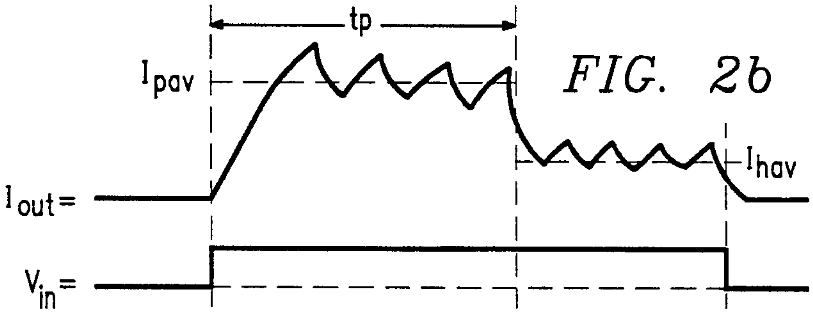
FIG. 2*b* is an exemplary timing diagram for the circuit depicted in FIG. 2A.
Figure 3A:
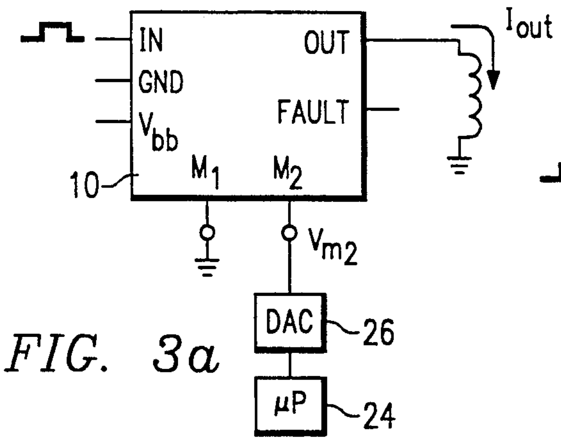
FIG. 3*a* is a block diagram of a 7-pin integrated circuit containing the present invention in a second mode of operation.

FIG. 2*b* depicts the operation of IC 10 in FIG. 2*a*. Signal $V_{in}$ is applied to pin IN. $V_{in}$ is typically a binary signal which indicates the solenoid should be retracted when $V_{in}$ is high and extended when $V_{in}$ is low (GND). When $V_{in}$ goes high, internal circuitry of IC 10 (shown in FIG. *2a*) causes the signal $I_{out}$ to be produced on the pin labelled OUT (shown also in FIG. *2a*). $I_{out}$ drives solenoid 22. Initially, $I_{out}$ rises to a relatively high "pull-in" current level which oscillates about an average pull-in current $I_{pav}$. This current level is required to cause the solenoid 22 to begin its operation. $I_{out}$ remains at $I_{par}$ for a "pull-in" time $t_p$. Once solenoid 22 (shown in FIG. *2a*) is energized, $I_{out}$ decreases to a "hold-in" current level which oscillates about an average hold-in current $I_{hav}$. $I_{out}$ then remains at the hold-in current $I_{hav}$ until $V_{in}$ goes low. The transition of $V_{in}$ from high to low indicates to IC 10 that the solenoid may return to its unenergized state. $I_{pav}$ and $I_{hav}$ oscillate about the two average current levels to maintain the core of the solenoid in the particular desired state. The three parameters, $I_{pav}$, $t_p$, and $I_{hav}$, are determined by the individual physical characteristics of solenoid 22. Therefore, it is necessary that the parameters be adjustable on IC 10 to suit a wide variety of possible solenoids.

Using $M_1$ and $M_2$ as the control pins, four control signals can be detected: the voltage at $M_1$, the current through $M_1$, the voltage at $M_2$, and the current through $M_2$. Any three of the four control signals may be independently varied, the fourth is dependent upon the other three. Thus, by sensing three of the four control signals, the IC 10 may be programmed by resistor network 20 to control up to three parameters of the output signal $I_{out}$.

In the illustrated embodiment, the three variables chosen are: $Var_1$ = voltage at $M_2$ pin, $Var_2$ = current through $M_1$ pin, (with $M_2$ in a high impedence state and a known voltage ($V_{refl}$) at $M_1$) and $Var_3$ = voltage at $M_1$ pin (with $M_1$ in a high impedence state and a known voltage ($V_{ref}$) at $M_2$). Thus, $Var_1 = V_{refl} * R_3/(R_2+R_3)$. $Var_2$ can also be determined as $Var_2 = V_{refl} * (R_1+R_2+R_3)/(R_1 * (R_2+R_3))$. To control solenoid 22, $Var_1$ could be used to set $I_{pav}$ and $Var_2$ could be used to set $t_p$. By forcing $M_2$ to a known voltage and putting $M_1$ into a high impedence state, $Var_3$ could be determined as $Var_3 = V_{refl} * R_1/(R_1+R_2)$. $Var_3$ could be used to set $I_{hav}$. Thus by choosing correct values for the three resistors, a desired set of $Var_1$, $Var_2$, and $Var_3$ can be obtained to control $I_{pav}$, $t_p$, and $I_{hav}$, respectively.

FIGS. *3a* and *3b* depict a second mode of operation of the disclosed invention. This mode is designed to allow a user to control $I_{out}$ in real-time with, for example, a feedback circuit attached to solenoid 22. In the "microprocessor control mode," $M_1$ is electrically shorted to ground. $M_2$ is connected to an analog time dependent voltage. Such a signal may be easily produced and controlled by the user through a microprocessor 24 and a digital to analog converter ("DAC") 26. These changes are external to IC 10 and are designed to be performed by the user as needed. Resistor $R_2$ of FIG. *2a* is also removed from pins $M_1$ and $M_2$.

In operation, the internal circuit driving $M_1$ includes a current limit circuit. Because $M_1$ is directly shorted to ground, the maximum current level is quickly reached at $M_1$. This maximum current level is detected by IC 10 and signals the internal circuitry of IC 10 to switch to this second mode of operation. In this mode, $Var_3$. = voltage on $M_2$. $I_{out}$ is immediately responsive to $Var_3$. In effect $t_p=0$. $I_{out}$ may therefore be controlled in real time by a user through microprocessor 24 and DAC 26.

In FIG. *3b*, the voltages at the $M_2$ and OUT pins, $V_{M2}$ and $I_{out}$, change as a function of time. The output, $I_{out}$, results from the operation of IC 10 in the microprocessor control mode. The output, $I_{out}$ parallels the changes of $Var_3$. In this case, $I_{out}$ is inversely related to $Var_3$. This relationship will be described more fully in connection with FIG. 4. $I_{out}$, however, may be related to $Var_2$ by other mathematical relationships which could be provided by circuitry internal to IC 10.

Figure 4:
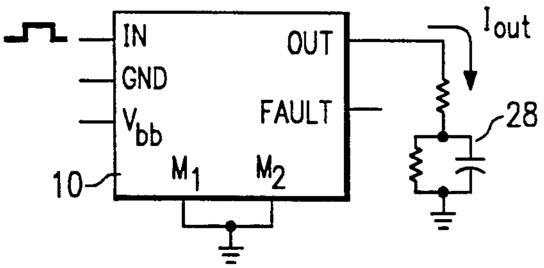
FIG. 4 is a schematic diagram of a 7-pin integrated circuit containing the disclosed invention in a third mode of operation.

FIG. 4 depicts IC 10 configured for a third, or "open-loop" mode of operation. The output of IC 10 is connected to a lamp depicted as a RC circuit 28. The open-loop mode is obtained by tying $M_1$ and $M_2$ to ground.

The open-loop mode is a user selected simplification of the microprocessor control mode described in connection with FIGS. *3a* and *3b*. In this application, lamp 28 needs a high current unmodulated power supply. The power supply does not need to vary as a function of time as in the first and second modes of operation. This result can be advantageously accomplished if IC 10 is designed such that $I_{out}$ is inversely related to $Var_3$ With such an architecture, the user can couple pin $M_2$ directly to ground and drive a lamp. The voltage drop at pin $M_2$ measured with reference to ground will be zero. Therefore, $I_{out}$ will, reach its maximum value and remain there as desired.

As in the first and second modes, IC 10 switches the reference voltage to pin $M_1$ when the input pin IN goes high. A maximum current state at $M_1$ signals IC 10 to immediately switch $Var_3$ to $I_{out}$ as in the second mode. The voltage at $M_2$ will be at its minimum causing $I_{out}$ to reach its maximum. $I_{out}$ will drop to zero when $V_{in}$ drops to a logic zero state.

Figure 5:
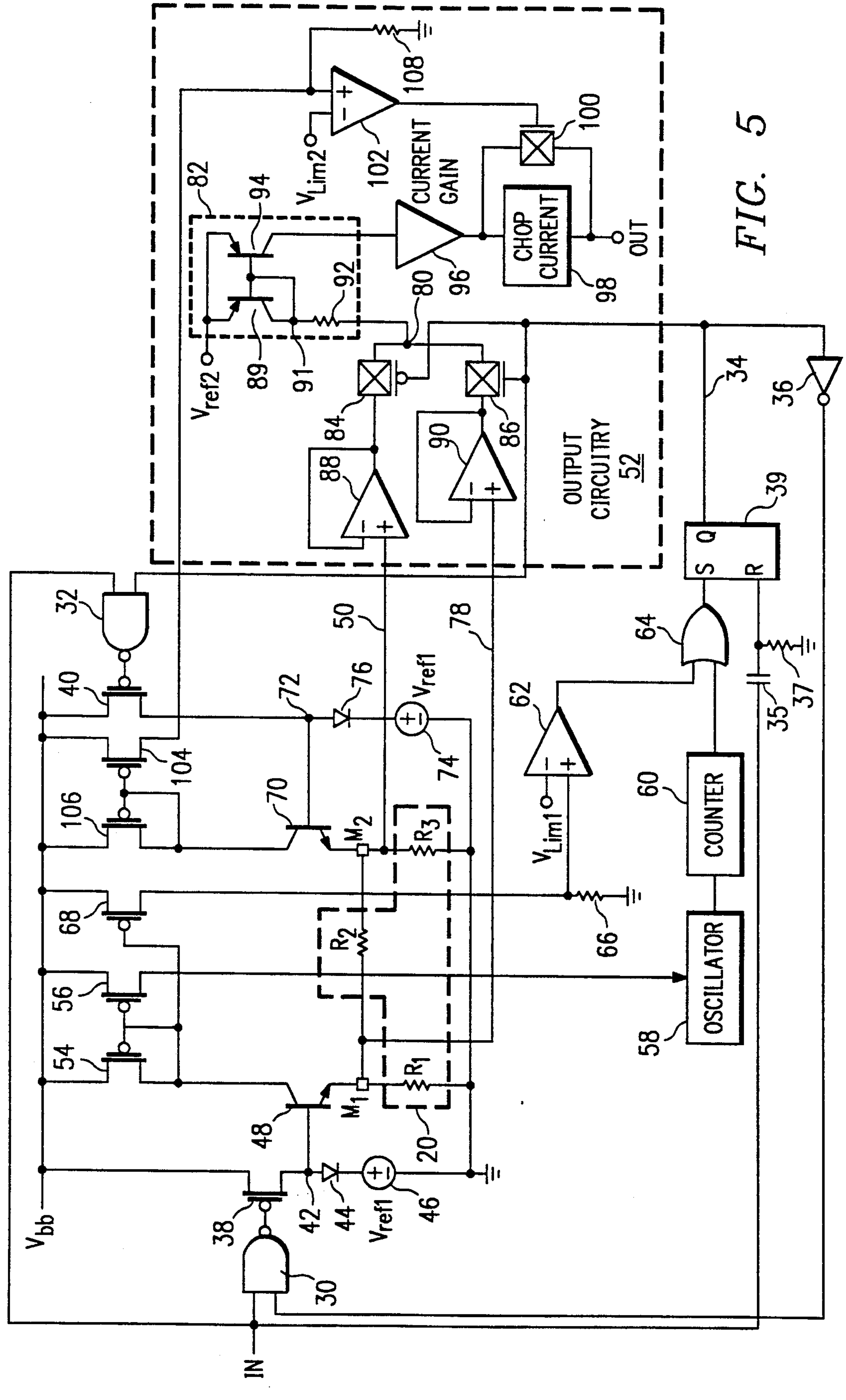
FIG. 5 is a schematic diagram of an integrated circuit comprising the disclosed invention.

FIG. 5 shows schematically a resistively programmable circuit capable of driving a solenoid or a lamp in one of the three modes described above. The input signal, labeled "IN", is logically combined at NAND gates 30 and 32 with an internal control signal. The internal control signal is resident on control line 34. The control signal is logically inverted by inverter 36 prior to combination with NAND gate 30. When IN goes to a logic high, it is differentiated by capacitor 35 and resistor 37. The result is applied to the reset input of latch 39. This forces control line 34 to be initially low. The signal on control line 34 is advantageously toggled low to high as will be described below to sequentially turn on first, PMOS transistor 38, and second, PMOS transistor 40.

When transistor 38 is on, node 42 is held at a voltage of one p-n junction voltage drop (approximately 0.7V) above $V_{refl}$. Voltage source 46 creates the $V_{refl}$ voltage and diode 44 creates the p-n junction voltage drop. Pin $M_1$ is therefore held to a voltage level of $V_{refl}$ once the p-n junction voltage drop caused by transistor 48 is taken into account. Resistive network 20 is attached to IC 10 (shown in FIG. *2a*) at pins $M_1$ and $M_2$ as described previously. The voltage at pin $M_2$ ($Var_1$) is sensed at line 50 and fed to output circuitry 52. Output circuitry 52 converts sensed $Var_1$ into the actual high current signal output through the pin labelled "OUT".

The current at pin $M_1$ ($Var_2$) is sensed by transistor 54, mirrored by transistor 56, and fed to oscillator 58 and counter 60. Oscillator 58 and counter 60 together time for a period ($t_p$) determined by the particular current flowing through pin $M_1$. In one embodiment, oscillator 58 produces a clock signal whose frequency is proportional to $Var_2$ and counter 60 counts for a fixed number of clock cycles. When counter 60 reaches the preset number of clock signals, it toggles its output. This sets latch 39 which causes control line 34 to toggle. A high current at pin $M_1$, would therefore cause a high frequency clock signal and would require a short time period before counter 60 counted to its preset number. A low current at pin $M_1$ would cause a low frequency clock signal which would require a longer time before counter 60 counted to its preset limit.

After the time $t_p$ has passed, counter 60 toggles low to high, setting latch 39, and causing control line 34 to toggle. The output of counter 60 is logically combined with the output from comparator 62 by OR gate 64. Comparator 62 and resistor 66 are connected to transistor 68 in parallel. Both see the current present at pin $M_1$ through transistor 68. When the current at pin $M_1$ exceeds a preset threshold ($V_{LIM1}$), the output of comparator 62 goes high setting latch 39 and causing control line 34 to toggle. When control line 34 toggles, transistor 38 is turned off and transistor 40 is turned is turned on as previously described. Such an operation is desirable when pin $M_1$ is grounded as in the microprocessor control or open-loop modes. Comparator 62 returns to a logic low state once transistors 38, 48, and 68 are turned off by control line 34.

When comparator 62 or counter 60 cause control line 34 to toggle, transistor 38 is turned off and transistor 40 is turned on. Transistor 40 then switches $V_{refl}$ to pin $M_2$ through transistor 70. Node 72 is held at $V_{refl}$ plus one p-n junction voltage drop (approximately 0.7V) by voltage source 74 and diode 76. Transistor 70 drops the voltage at node 72 by one p-n junction voltage drop before it reaches pin $M_2$. The resulting voltage at pin M, ($Var_3$) is then transmitted by line 78 to output circuitry 52. Output circuitry 52 converts measured $Var_3$ into the high current signal output through the pin labeled "OUT".

When the "IN" signal goes low, both transistors 38 and 40 are turned off regardless of whether an overcurrent state exists or whether $t_p$ has elapsed.

Output circuitry 52 converts measured $Var_1$ and $Var_3$ into a high current signal suitable for driving a solenoid or lamp. Control line 34 alternately connects and disconnects lines 50 and 78 from node 80 and current inverter 82 by switches 84 and 86. Switches 84 and 86 are particularly wired so that switch 84 is closed when $Var_1$ is being measured and switch 86 is closed when $Var_3$ is being measured. Both switches are otherwise open and non-conducting. Unity gain buffers 88 and 90 isolate the measured voltages present on lines 50 and 78 from the remainder of the circuitry of output circuitry 52.

Current inverter 82 converts the voltage at node 80 into a current and mathematically inverts the current. IC 10 is thereby able to operate in the open-loop mode as desired and described in connection with FIG. 4. In one embodiment, transistor 89 holds node 91 at a generally constant voltage, $V_{refl}$ less the base to emitter voltage drop of transistor 89. Resistor 92 thereby causes the current through node 91 to increase as the voltage at node 80 decreases. Conversely, the current at node 91 will decrease as the voltage at node 80 increases. The current through node 91 is mirrored by transistor 94 and then amplified to the desired level by amplifier 96.

Figure 3B:
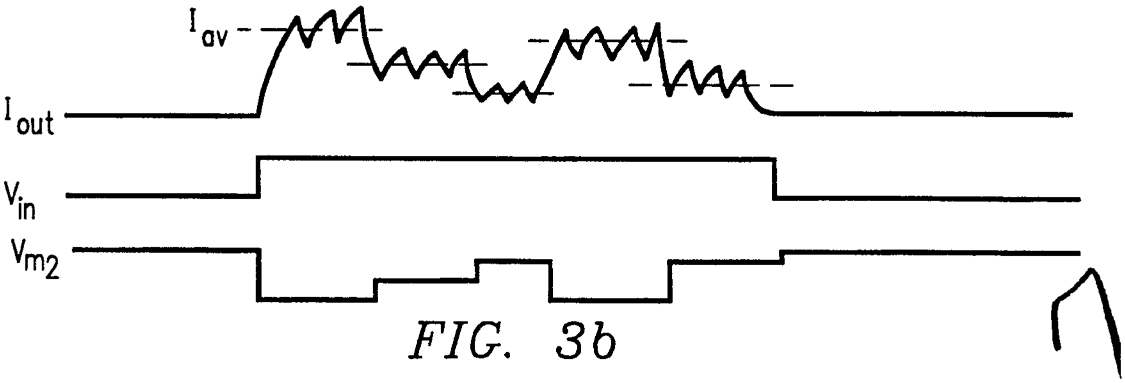
FIG. 3*b* is an exemplary timing diagram for the circuit depicted in FIG. 3*a;*

Once amplified, the output signal is either shaped by shaper 98 or directly output through by-pass switch 100. Shaper 98 gives the output signal the distinctive shark-fin pattern depicted in FIGS. 2*b* and 3*b*. This current wave-form shape is necessary to drive a solenoid in the first and second modes of operation. The output signal need not be so shaped when driving a lamp in the open-loop mode. In the third mode, the signal therefore bypasses shaper 98 through bypass switch 100. Bypass switch 100 is opened and closed by comparator 102 when an overcurrent state is detected at pin $M_2$. Transistor 104 mirrors the current passing through transistors 70 and 106 and relays the measured value to comparator 102 and resister 108. If the current exceeds a preset value, $V_{LIM2}$, comparator 102 closes bypass switch 100 thus diverting the output signal from shaper 98. Such an overcurrent state would occur in the open-loop mode when pin $M_2$ is shorted to ground.

While the present invention has been described in connection with using two control pins to provide three control signals, variations would allow a greater number of control signals to be generated by using additional pins and additional resistors. The resistors would be connected between pairs of pins and between a pin and a known voltage level such as ground. Another reference voltage ($V_{refl}$) would be switched sequentially to each node and the resulting currents and voltages would be used to control the device.

Although the present invention has been described in detail, it should be understood that various changes, substitutions and alterations can be made without departing from the spirit and scope of the invention as assigned by the appended claims.

We claim:

1. A resistivity programmable interface for controlling an analog device, the interface comprising:

input circuitry having a plurality of input nodes;

sensing circuitry for sensing the voltages and currents at said nodes; and controlling circuitry for generating control signals, each control signal responsive to one of said sensed voltages or currents such that the number of control signals exceeds the number of nodes at which voltages and currents are sensed.

2. The interface of claim 1 wherein said sensing circuitry further comprises switching circuitry operable to selectively switch a first reference voltage to said nodes.

3. The interface of claim 1 wherein said input circuitry comprises two input nodes and said controlling circuitry generates three control signals responsive to the sensed voltage and currents at each of said two input nodes.

4. The interface of claim 1 wherein said controlling circuitry further comprises:

converting circuitry operable to sequentially generate a first and second current level; and timing circuitry for determining the duration of said first current level.

5. The interface of claim 4 wherein said timing circuitry comprises an oscillator circuit.

6. The interface of claim 4 wherein said second current level is inversely proportional to one of said sensed voltages or currents.

7. The interface of claim 1 wherein said controlling circuitry is operable to generate a current level responsive to a sensed time dependent input voltage.

8. The interface of claim 1 wherein said controlling circuitry is operable to generate a constant output current level.

9. A method of controlling an analog device with an interface, the interface comprising a network of three resistive devices, the devices coupled in a triangular configuration, the network comprising three nodes, the first node coupled to a first known voltage level, the second and third nodes coupled to the interface, the method comprising the steps of:

switching a second reference voltage to the second node;

sensing the voltage at the third node and the current at the second node;

generating a first current level determined by the voltage at the third node;

maintaining the first current level for a period of time, the period of time determined by the current at the second node;

switching the second reference voltage to the third node;

sensing either the voltage at the second node or the current at the third node; and generating a second current level after the period of time, the second current level determined by either the voltage drop at the third node or the current at the second node.

10. An interface for controlling an analog device the interface comprising:

input circuitry for accepting three resistive devices, said resistive devices coupled in a triangular configuration, said configuration comprising three nodes, said first node coupled to a voltage level, the second and third nodes coupled to said input circuitry;

control circuitry for switching a first reference voltage between the second and third nodes and for sensing the currents and voltages at said second and third nodes;

driver circuitry operable to generate a first selected current level for a selected period of time and a second selected current level, said current levels and period of time determined by said sensed currents and voltages.

11. The interface of claim 10 wherein said second current level is inversely proportional to one of said sensed currents and voltages.

12. The interface of claim 11 wherein said driver circuitry is operable to generate a constant output current level.

13. The interface of claim 10 wherein said driver circuitry is operable to generate a current level responsive to a sensed time dependent voltage at one of said second and third nodes.

14. The interface of claim 10 wherein said driver circuitry is operable to generate a constant current level.

15. A method of controlling an analog device with an interface, the interface comprising a plurality of input nodes, the method comprising the steps of:

switching a reference voltage to a first of the nodes;

sensing the voltages and the currents at certain of the nodes; switching the reference voltage to a second node;

sensing the voltages and the currents at certain of the nodes; and generating control signals responsive to the sensed voltages and currents such that the number of control signals exceeds the number of nodes at which voltages and currents are sensed.

16. The method of claim 15 wherein said generating step further comprises:

generating a first current level determined by the voltage at the second node;

maintaining the first current level for a period of time, the period of time determined by the current at the first node; and generating a second current level after the period of time, the second current level determined by either the voltage at the first node or the current at the second node.

17. A programmable interface for controlling an analog device, comprising:

first and second programming nodes for coupling to a programming circuit;

a first circuit for generating a first control signal in response to a first electrical parameter at said first programming node;

a second circuit for generating a second control signal in response to a second electrical parameter at said first programming node;

a third circuit for generating a third control signal in response to a first electrical parameter at said second programming node;

a first switching circuit responsive to said second control signal for selecting one of said first and third control signals; and a circuit for producing an output signal in response to the selected one of said first and third control signals.

18. The programmable interface of claim 17 further comprising a second switching circuit responsive to an input signal and said second control signal for selectively switching a first reference voltage to said first node; and a third switching circuit responsive to said input signal and said second control signal for selectively switching a second reference voltage to said second node.

19. The programmable interface of claim 18 in which each of said input signal and said second control signal have first and second states, said second switching circuit responsive to said first state of said input signal and said first state of said second control signal to switch said first reference voltage to said first node and responsive to said first state of said input signal and said second state of said second control signal to disconnect said first reference voltage from said first node, said third switching circuit responsive to said first state of said input signal and said second state of said second control signal to switch said second reference voltage to said second node and responsive to said first state of said input signal and said first state of said second control signal to disconnect said second reference voltage from said second node.

20. The programmable interface of claim 17 in which said programming circuit includes three resistive devices coupled in a triangular configuration having three nodes, a first node of said configuration coupled to a voltage level, a second node of said configuration coupled to said first programming node, and a third node of said configuration coupled to said second programming node.

21. The programmable interface of claim 17 in which said first electrical parameter at said first programming node is the voltage at said first programming node, said second electrical parameter at said first programming node is the current at said first programming node, and said first electrical parameter at said second programming node is the voltage at said second programming node.

22. The programmable interface of claim 21 in which said first circuit for generating a first control signal includes a first buffer coupled to said first programming node and said third circuit for generating a third control signal includes a second buffer coupled to said second programming node.

23. The programmable interface of claim 22 in which said first and second buffers are unity gain buffers.

24. The programmable interface of claim 22 in which said second circuit for generating a second control signal includes a first transistor and a second transistor, said first transistor having a current path connected between said first programming node and a voltage source and a control electrode connected between said current path of said first transistor and said first programming node, said second transistor having a current path connected between said voltage source and a timing circuit and a control electrode connected to the control electrode of said first transistor.

25. The programmable interface of claim 24 in which said second circuit for generating a second control signal includes a third transistor having a current path connected between said voltage source and a threshold circuit and a control electrode connected to the control electrode of said first transistor.

26. The programmable interface of claim 24 in which said timing circuit includes an oscillator connected to the current path of said second transistor and a counter connected to said oscillator.

27. The programmable interface of claim 24 in which said circuit for producing an output signal includes a current inverter and said first switching circuit includes a first switch having a current path connected between said first buffer and said current inverter and a second switch having a current path connected between said second buffer and said current inverter, each of said first and second switches having control electrodes for receiving said second control signal.

* * * * *